(12) United States Patent
Kikugawa et al.

(10) Patent No.: US 8,323,856 B2
(45) Date of Patent: Dec. 4, 2012

(54) MASK BLANKS

(75) Inventors: Shinya Kikugawa, Tokyo (JP); Akira Takada, Tokyo (JP); Satoru Takaki, Tokyo (JP); Yosuke Sato, Tokyo (JP); Yasuhiko Akao, Yonezawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/941,491

(22) Filed: Nov. 8, 2010

(65) Prior Publication Data

US 2011/0053059 A1    Mar. 3, 2011

Related U.S. Application Data

(63) Continuation of application No. 11/836,304, filed as application No. PCT/JP2006/302575 on Feb. 8, 2006, now abandoned.

(30) Foreign Application Priority Data

Feb. 9, 2005  (JP) .................................. 2005-033098

(51) Int. Cl.
G03F 1/22    (2012.01)
(52) U.S. Cl. ......................................................... 430/5
(58) Field of Classification Search ...... 430/5; 428/428, 428/430; 501/54
See application file for complete search history.

(56) References Cited

U.S. PATENT DOCUMENTS

| 6,087,047 | A | 7/2000 | Mitsui et al. |
| 6,242,136 | B1 | 6/2001 | Moore et al. |
| 6,410,192 | B1 | 6/2002 | Priestley et al. |
| 6,413,682 | B1 * | 7/2002 | Shibano et al. ............ 430/5 |
| 6,480,518 | B1 * | 11/2002 | Fujinoki et al. ............ 372/57 |
| 2001/0018834 | A1 | 9/2001 | Matsuo et al. |
| 2001/0028869 | A1 | 10/2001 | Caren et al. |
| 2002/0068228 | A1 | 6/2002 | Kureishi et al. |
| 2003/0186624 | A1 | 10/2003 | Koike et al. |
| 2004/0121247 | A1 | 6/2004 | Berkey et al. |
| 2006/0246363 | A1 | 11/2006 | Kikugawa et al. |

FOREIGN PATENT DOCUMENTS

| EP | 1 035 084 | 9/2000 |
| EP | 1 219 571 | 7/2002 |
| EP | 1 084 995 | 3/2004 |
| JP | 2000-264671 | 9/2000 |
| JP | 2002-169265 | 6/2002 |
| JP | 2003-515192 | 4/2003 |
| JP | 2005-255423 | 9/2005 |
| WO | WO 03/027035 | 4/2003 |
| WO | 2004/078663 | 9/2004 |

OTHER PUBLICATIONS

Asawaki, Basis of Thin Film Production, 2$^{nd}$ Ed., published Nikkan Kogyo Shimbun, Ltd. Jun. 25, 1985.
Wang, Journal of Microlithography, Microfabrication Microsystems, 1(1): 2002, 43-48 XP008063694.
Notification of Reasons for Rejection issued Jun. 14, 2010 in Japanese Patent Application No. 2006-029919 (with English translation).

* cited by examiner

Primary Examiner — Stephen Rosasco
(74) Attorney, Agent, or Firm — Oblon, Spivak, McClelland, Maier & Neustadt, L.L.P.

(57) ABSTRACT

The present invention provides a mask blank which comprises a substrate made of a synthetic quartz glass and a light-shielding film laminated on a surface of the substrate and is for use in a semiconductor device production technique employing an exposure light wavelength of 200 nm or shorter, wherein the mask blank has a birefringence, as measured at a wavelength of 193 nm, of 1 nm or less per substrate thickness. According to the present invention, mask blanks suitable for use in the immersion exposure technique and the polarized illumination technique are provided.

24 Claims, No Drawings

MASK BLANKS

CROSS REFERENCE TO RELATED APPLICATION

This application is a continuation of U.S. application Ser. No. 11/836,304, filed on Aug. 9, 2007 now abandoned, which is a continuation of PCT/JP06/302575, filed on Feb. 8, 2006, and claims priority to Japanese Patent Application No. 2005-033098, filed on Feb. 9, 2005.

TECHNICAL FIELD

The present invention relates to mask blanks for use in a semiconductor device production technique employing an exposure light wavelength of 200 nm or shorter. More particularly, the invention relates to mask blanks for use with a lithographic exposure tool employing an ArF excimer laser (wavelength, 193 nm), $F_2$ laser (wavelength, 157 nm), or the like as a light source.

BACKGROUND ART

In the production of semiconductor integrated circuits, lithographic exposure tools for reductively projecting and transferring a fine circuit pattern drawn in a photomask onto a wafer are extensively used. With the trend toward higher degrees of integration and higher functions in circuits, the circuits are becoming finer and the lithographic exposure tools have come to be required to form a high-resolution circuit pattern image on a wafer surface while attaining a large focal depth. The wavelengths of exposure light sources are becoming shorter. KrF excimer lasers (wavelength, 248 nm) and ArF excimer lasers (wavelength, 193 nm) are being used as exposure light sources in place of the g-line (wavelength, 436 nm) and i-line (wavelength, 365 nm) heretofore in use.

Photomask substrates mainly used for lithographic exposure tools employing such exposure light sources are ones made of a synthetic quartz glass, because synthetic quartz glasses have advantages, for example, that they have excellent transparency to light in a wide range of from the near infrared region to the ultraviolet region, have an extremely low coefficient of thermal expansion, and can be processed relatively easily. Photomask substrates for, e.g., ArF excimer lasers are required to have a surface flatness of about 0.5 μm, a parallelism of about 5 μm, and a birefringence of about 4 to 10 nm/cm besides resistance to ArF excimer laser light.

Recently, the technique of immersion exposure is known in which exposure with a lithographic exposure tool is conducted while filling the space between the projection lens of the lithographic exposure tool and the wafer with a liquid in order to attain a higher resolution with an ArF excimer laser. The shorter the exposure light wavelength and the larger the NA (numerical aperture) of the projection lens, the higher the resolution for the lithographic exposure tool becomes. The resolution can be represented by the following expressions.

$$\text{Resolution} = [k \text{ (process coefficient)} \times \lambda \text{(exposure light wavelength)}]/\text{NA}$$

$$\text{NA} = n \times \sin\theta$$

In the expressions, n indicates the refractive index of the medium through which the exposure light passes. In exposure techniques heretofore in use, n is 1.0 because the medium is the air. In this immersion exposure, however, pure water, which has an n of 1.44, is used as the medium and the lithographic exposure tool can hence attain an even higher resolution.

Furthermore, the polarized illumination technique is known in which polarized lights which exert an adverse influence on resolution are diminished to thereby heighten image-forming contrast and improve resolution, in contrast to the exposure techniques heretofore in use which employ an exposure light composed of random polarized lights having various polarization directions.

The photomasks for use in such immersion exposure technique and/or polarized illumination technique are required to have low birefringence so as not to disorder the polarization of the exposure light which passes therethrough. A photomask substrate having a birefringence reduced to 2 nm/cm or less has hence been proposed (see, for example, patent document 1).

Patent Document 1: JP-T-2003-515192

In patent document 1, the birefringence of the photomask substrate is specified. This birefringence of the photomask substrate is mainly attributable to a residual strain in the synthetic quartz glass used as the photomask substrate. However, in the case of a mask blank comprising a photomask substrate and a light-shielding film laminated thereon, the birefringence thereof is attributable also to the stress imposed by the light-shielding film laminated on a surface of the photomask substrate. It is therefor necessary that this film stress should be taken into account in regulating the birefringence of a mask blank comprising a photomask substrate and a light-shielding film laminated on a surface of the substrate.

DISCLOSURE OF THE INVENTION

The invention has been achieved in view of the problems described above.

An object of the invention is to provide mask blanks suitable for use in the immersion exposure technique and/or the polarized illumination technique.

The invention provides a mask blank which comprises a substrate made of a synthetic quartz glass and a light-shielding film laminated on a surface of the substrate and is for use in a semiconductor device production technique employing an exposure light wavelength of 200 nm or shorter, wherein the mask blank has a birefringence, as measured at a wavelength of 193 nm, of 1 nm or less per substrate thickness.

The invention further provides a mask blank which comprises a substrate made of a synthetic quartz glass and a light-shielding film laminated on a surface of the substrate and is for use in a semiconductor device production technique employing an exposure light wavelength of 200 nm or shorter, wherein when a light-transmitting area of 260 nm×1,040 nm is formed in the light-shielding film, then the birefringence at this light-transmitting area, as measured at a wavelength of 193 nm, is 1 nm or less per substrate thickness.

The invention still further provides a mask blank which comprises a substrate made of a synthetic quartz glass and a light-shielding film laminated on a surface of the substrate and is for use in a semiconductor device production technique employing an exposure light wavelength of 200 nm or shorter, wherein the substrate has a birefringence, as measured at a wavelength of 193 nm, of 0.5 nm or less per substrate thickness, and wherein the light-shielding film has a film stress of 800 MPa or lower.

The invention furthermore provides a mask blank which comprises a substrate made of a synthetic quartz glass and a light-shielding film laminated on a surface of the substrate and is for use in a semiconductor device production technique employing an exposure light wavelength of 200 nm or shorter, wherein the substrate has a birefringence, as measured at a wavelength of 193 nm, of 0.5 nm or less per substrate thickness, and wherein the mask blank has a warpage amount of 2 μm or smaller.

The mask blanks of the invention have a low birefringence and are suitable for use in the immersion exposure technique and/or the polarized illumination technique.

BEST MODE FOR CARRYING OUT THE INVENTION

The mask blanks of the invention are constituted of a photomask substrate made of a synthetic quartz glass and a light-shielding film laminated on a surface thereof. The synthetic quartz glass constituting the photomask substrate can be produced, for example, by the following methods.

First, a silicon-containing compound as a raw material and oxygen gas, hydrogen gas, nitrogen gas, etc. are supplied to a burner made of quartz glass. The raw material is caused to undergo a hydrolysis reaction or oxidation reaction in an oxyhydrogen flame to thereby synthesize a quartz glass. Examples of this synthesis method include the direct process and the soot process (e.g., the VAD process, OVD process, or indirect process).

The direct process is a process in which a silicon-containing compound is subjected to flame hydrolysis at a temperature of 1,500 to 2,000° C. to synthesize $SiO_2$ particles and the particles are deposited on and fused to a target to thereby directly synthesize a transparent synthetic quartz glass body.

On the other hand, the soot process is a process which comprises subjecting a silicon-containing compound to flame hydrolysis at a temperature of 1,000 to 1,500° C. to synthesize $SiO_2$ particles, depositing the particles on a target to thereby first obtain a porous synthetic quartz glass body, and then heating this porous synthetic quartz glass body to a temperature of 1,400 to 1,500° C. to thereby densify it and obtain a transparent synthetic quartz glass body.

The VAD process is preferred because the reaction temperature during synthesis is relatively low and it is possible to relatively freely regulate the composition and the concentration of defects. In particular, the low reaction temperature during synthesis has an advantage that the synthetic quartz glass synthesized from a chlorine-containing raw material such as $SiCl_4$ by the VAD process has a lower chlorine concentration than that by the direct process. In this point also, the VAD process is preferred.

The raw material for the synthetic quartz glass is not particularly limited as long as it can be gasified. Examples thereof include silicon halide compounds such as chlorides, e.g., $SiCl_4$, $SiHCl_3$, $SiH_2Cl_2$, and $SiCH_3Cl_3$, and fluorides, e.g., $SiF_4$, $SiHF_3$, and $SiH_2F_2$, and halogen-free silicon compounds such as alkoxysilanes represented by $R_nSi(OR)_{4-n}$ (wherein R is an alkyl group having 1 to 4 carbon atoms and n is an integer of 0 to 3) and $(CH_3)_3Si-O-Si(CH_3)_3$.

Use of a chloride as a raw material gives a synthetic quartz glass which contains residual chlorine derived from the raw material. It is therefore preferred to use as a raw material an organosilicon compound or fluoride which contains no chlorine. It should, however, be noted that use of a fluoride as a raw material frequently poses a problem concerning safety and handling because hydrofluoric acid (HF) is generated as a by-product during the synthesis. Consequently, the raw material preferably is an organosilicon compound containing no halogen.

In the case where the VAD process is used for synthesizing a synthetic quartz glass, the concentrations of oxygen-excess defects, dissolved oxygen molecules, and oxygen-deficient defects in the synthetic quartz glass can be regulated by several methods. Examples of the methods include (1) a method in which the proportions of oxygen gas and hydrogen gas in the feed gases are regulated, (2) a method in which a porous synthetic quartz glass body is treated with a reducing substance such as a compound containing fluorine or chlorine, and (3) a method in which the conditions under which a porous synthetic quartz glass body is densified to obtain a transparent synthetic quartz glass body are regulated.

Method (1) is a technique in which the proportion of hydrogen gas to oxygen gas in the feed gases is regulated to a value higher than 2 which is the stoichiometric ratio, i.e., set at a value in the range of 2.0 to 2.5, to synthesize a porous synthetic quartz glass body.

Method (2) is a technique in which a porous synthetic quartz glass body is heat-treated at a temperature of from room temperature to 1,200° C. in an atmosphere containing a reducing substance such as a fluorine-containing compound, hydrogen gas, or CO gas. Examples of the fluorine-containing compound include $CF_4$, $SiF_4$, and $SF_6$. In the case where a compound containing fluorine or chlorine or CO gas is used, it is desired to use a mixed gas prepared by diluting such gas with an inert gas (e.g., nitrogen, helium, or argon) to a concentration in the range of 0.01 to 10 vol %, preferably 0.05 to 5 vol %, because those gases have extremely high reducing properties. The treatment in this case is preferably conducted at a temperature of from room temperature to about 1,000° C. at a pressure of the atmosphere of 1 to 101 kPa. In the case where hydrogen gas is used, it is preferred to conduct the heat treatment in an inert gas containing 50 to 100 vol % hydrogen gas under the conditions of 1 to 10 atm and 800 to 1,200° C. In the treatment with any of those reducing gases, the porous synthetic quartz glass body is first held in a reduced-pressure atmosphere and the gas is introduced until the reduced pressure is elevated to a given pressure, whereby the porous quartz glass body can be evenly treated efficiently.

Method (3) is a technique in which the porous synthetic quartz glass body synthesized is held at a temperature of 1,100 to 1,300° C., preferably 1,200 to 1,300° C., for 20 to 200 hours in a reduced-pressure atmosphere consisting of a 100 vol % inert gas, such as helium or nitrogen, and having a pressure of from 10 Pa to 10 kPa using a graphite furnace employing high-purity carbon in the heater and as the heat insulator and being capable of atmosphere control or using a metal furnace employing tungsten or molybdenum as a reflector and in the heater, and then densified by heating to 1,400 to 1,500° C. in that atmosphere to thereby obtain a transparent synthetic quartz glass body.

The concentrations of oxygen-excess defects, dissolved oxygen molecules, and oxygen-deficient defects in the synthetic quartz glass can be regulated by conducting any one of methods (1) to (3) described above or by conducting two or more thereof in combination.

Distorted bonding structures in the synthetic quartz glass are precursors for defects such as the E' centers and NBOHC which are generated upon ultraviolet irradiation. The concentration thereof preferably is lower. Specifically, in a laser Raman spectrum, the ratios of the intensity of the scattering peak at 495 $cm^{-1}$ ($I_{495}$) and that of the scattering peak at 606 $cm^{-1}$ ($I_{606}$) to that of the scattering peak at 440 $cm^{-1}$ ($I_{440}$), i.e., $I_{495}/I_{440}$ and $I_{606}/I_{440}$, are preferably 0.585 or lower and 0.136 or lower, respectively.

It is also preferred to reduce the sodium concentration in the synthetic quartz glass. To reduce the sodium concentration in the synthetic quartz glass to 5 ppb or lower is effective. The sodium concentration is especially preferably 3 ppb or lower. To regulate the sodium concentration so that the difference between the maximum and minimum values thereof is 3 ppb or smaller is effective in reducing fluctuations in birefringence in the range of exposure light wavelengths. The term "maximum value" or "minimum value" of sodium concentration herein means the largest value or smallest value among the found sodium concentration values determined for respective points.

By regulating the synthetic quartz glass so as to have a chlorine concentration of 10 ppm or lower, preferably to contain substantially no chlorine, the change in refractive index and decrease in transmittance which occur upon ultraviolet irradiation can be reduced to a sufficiently low level. The chlorine concentration in the synthetic quartz glass can be determined by fluorescent X-ray spectroscopy. The detection limit for this analysis is 10 ppm. When the chlorine concentration in the synthetic quartz glass exceeds the upper limit in that range, there is a possibility that a larger decrease in transmittance and a larger change in refractive index might be caused by ultraviolet irradiation.

Furthermore, by regulating the synthetic quartz glass so as to have an OH group concentration of 100 ppm or lower, preferably 50 ppm or lower, the change in refractive index and decrease in transmittance which occur upon ultraviolet irradiation can be reduced to a sufficiently low level. The OH group concentration can be determined with an infrared spectrophotometer by the method according to a document (*Cer. Bull.*, 55(5), 524 (1976)). The detection limit for this analysis is 1 ppm. When the OH group concentration in the synthetic quartz glass exceeds the upper limit in that range, there is a possibility that a larger decrease in transmittance and a larger change in refractive index might be caused by ultraviolet irradiation.

Metal impurities present in the synthetic quartz glass, such as alkali metals (e.g., Na, K, and Li), alkaline earth metals (e.g., Mg and Ca), and transition metals (e.g., Fe, Ni, Cr, Cu, Mo, W, Al, Ti, and Ce), not only reduce light transmittance in the range of from the ultraviolet region to the vacuum ultraviolet region, but also are causative of light resistance deterioration. Because of this, the content of such metal impurities preferably is as low as possible. Specifically, the total content of metal impurities is preferably 100 ppb or lower, especially preferably 50 ppb or lower.

Hydrogen molecules can be incorporated in the synthetic quartz glass in an amount in the range of from $5 \times 10^{15}$ to $1 \times 10^{19}$ molecules per cm$^3$. Hydrogen molecules in the synthetic quartz glass serve to repair paramagnetic defects such as the E' centers and nonbridging oxygen radicals which are generated upon ultraviolet irradiation and thereby have the effect of inhibiting the transmittance from decreasing upon ultraviolet irradiation.

Fluorine can be incorporated in the synthetic quartz glass in an amount of 100 to 10,000 ppm. Fluorine is effective in diminishing unstable structures in the synthetic quartz glass and improving ultraviolet resistance. However, when the fluorine content in the glass is lower than 100 ppm, there are cases where unstable structures in the synthetic quartz glass are not diminishing to a sufficient level. When the glass contains fluorine in an amount exceeding 10,000 ppm, there is a possibility that reduced defects might be generated, resulting in reduced ultraviolet resistance.

In order that the synthetic quartz glass having the composition described above might have a reduced birefringence so as to be used as an optical member, it is preferred to suitably conduct heat treatments for imparting optical properties required of the optical member, such as homogenization, molding, and annealing (hereinafter referred to as optical heat treatments). Such optical heat treatments are conducted after a dense and transparent synthetic quartz glass has been obtained.

Among those optical heat treatments, annealing is closely related to the birefringence of the synthetic quartz glass to be obtained. In order to impart a low birefringence to the synthetic quartz glass, the glass is held at a temperature of 1,250° C. or higher for 5 hours or longer and then gradually cooled to 1,050° C. at a cooling rate of preferably 5° C./hr or lower, more preferably 3° C./hr or lower. Although this annealing may be conducted in air, it is effective to conduct the treatment under vacuum. The degree of vacuum is preferably 10 Pa or a lower pressure, more preferably 1 Pa or a lower pressure. That is, the annealing treatment is preferably carried out in the atmosphere having a pressure of 10 Pa or lower, more preferably 1 Pa or lower.

A photomask substrate is produced from the synthetic quartz glass thus obtained. The photomask substrate preferably has such durability that when it is irradiated using an Xe excimer lamp at an irradiance of 13.2 mW/cm$^2$ for 20 minutes, then the decrease in light transmittance as measured at a wavelength of 217 nm, in terms of the difference between the light transmittance before the irradiation and that after the irradiation, is 1.0% at the most.

The photomask substrate having such high durability is preferably obtained in the following manner. Namely, as long as the synthetic quartz glass contains substantially no oxygen-excess defects and substantially no dissolved oxygen molecules, the decrease in transmittance and change in refractive index which occur upon ultraviolet irradiation can be sufficiently reduced. That the synthetic quartz glass contains substantially no oxygen-excess defects and substantially no dissolved oxygen molecules means that the concentrations as determined respectively by the detection methods described below are not higher than the detection limits.

The concentration of dissolved oxygen molecules can be determined by Raman spectrometry according to a literature (L. Skuja et al., *J. Appl. Phys.*, Vol. 83, No. 11, pp. 6106-6110 (1998)). The detection limit for this method is $1 \times 10^{17}$ molecules per cm$^3$. The concentration of oxygen-excess defects can be evaluated based on the increase in OH group concentration through a heat treatment at 700 to 1,000° C. in an atmosphere comprising hydrogen gas. For example, a test piece of the synthetic quartz glass having dimensions of 10×10×100 mm is heat-treated at 800° C. for 100 hours in a 1-atm atmosphere consisting of 100% hydrogen gas and the increase in OH group concentration through this heat treatment is determined with an infrared spectrophotometer according to the method described in a document (*Cer. Bull.*, 55(5), 524 (1976)). The detection limit for this method is $1 \times 10^{16}$ molecules per cm$^3$.

As long as the synthetic quartz glass contains substantially no reduced defects, the decrease in transmittance and change in refractive index which occur upon ultraviolet irradiation can be reduced to a sufficiently low level. That the synthetic quartz glass contains substantially no reduced defects means that no peak attributable to SiH is observed at around 2,250 cm$^{-1}$ in Raman spectrometry.

With respect to the concentration of oxygen-deficient defects in the synthetic quartz glass, the concentration thereof is reduced to $5 \times 10^{14}$ defects per cm$^3$ or lower. Thus, the decrease in transmittance which occurs upon ultraviolet irradiation can be sufficiently inhibited.

The concentration of oxygen-deficient defects in the synthetic quartz glass can be determined from the intensity of the blue fluorescence which is emitted by ultraviolet irradiation and has a peak at around the wavelength range of 280 to 300 nm. Namely, a fiber lightguide type spectrophotometer equipped with a multi-channel photodiode (e.g., spectrophotometer MCPD 2000, manufactured by Otsuka Electronics Co., Ltd.) or the like is used to measure the intensity of the scattered light derived from ArF excimer laser light and the intensity of the blue fluorescence peak centering at around a wavelength of 280 to 300 nm. When the proportion of the intensity of the blue fluorescence peak to the intensity of the scattered light having a wavelength of 193 nm is $5\times10^{-3}$ or lower, the concentration of oxygen-deficient defects in the synthetic quartz glass can be judged to be within the range shown above. When that intensity ratio exceeds $5\times10^{-3}$, this means that the concentration of oxygen-deficient defects in the synthetic quartz glass exceeds $5\times10^{14}$ defects per $cm^3$ and there is hence a possibility that a decrease in transmittance might occur upon ultraviolet irradiation.

The relationship between that intensity ratio and the concentration of oxygen-deficient defects was determined from the absorption band attributable to oxygen-deficient defects and centering at 163 nm. Namely, the concentration of oxygen-deficient defects was determined from the intensity of the absorption at a wavelength of 163 nm, and a synthetic-quartz-glass sample of which the concentration of the oxygen-deficient defects had been known was examined for the intensity of blue fluorescence. Thus, the relationship between the intensity ratio I of the blue fluorescence to the scattered light having a wavelength of 193 nm and the concentration of oxygen-deficient defects $C_{ODC}$ (defects/$cm^3$) was obtained, which is represented by the following equation.

$$C_{ODC}=1.16\times10^{17}\times I$$

That surface of the photomask substrate on which a light-shielding film is to be laminated (hereinafter, the surface is often referred to as "pattern formation side") preferably has a flatness of 0.25 µm or a smaller value, and the opposite side thereof preferably has a flatness of 1 µm or a smaller value. In addition, the parallelism of the two sides preferably is 5 µm or a smaller value. The photomask substrate satisfying these requirements enables sufficient exposure precision to be secured even when polarized illumination is used or immersion exposure is conducted.

The photomask substrate having such properties can be produced, for example, by the following method.

A synthetic-quartz-glass plate having outside dimensions larger by at least 10 mm than the dimensions of the photomask substrate is first polished and then cut into the given dimensions to thereby produce the photomask substrate. Alternatively, a synthetic-quartz-glass plate having a dummy processing part attached to the periphery thereof is polished to thereby produce the photomask substrate.

Namely, a synthetic-quartz-glass plate larger by at least 10 mm than the outside dimensions of the photomask substrate to be used is polished and finished so as to have a given thickness, and a peripheral part is then cut off. Thus, a photomask substrate having satisfactory thickness fluctuations is obtained. In the other method, a dummy processing part having the same thickness as the photomask substrate to be produced is disposed in place of the cutting allowance on the periphery of a synthetic-quartz-glass plate, and this glass plate is set on a carrier like the photomask substrate, whereby sagging at the periphery is diminished.

The dummy processing part preferably has a width of 10 mm or larger. The dummy processing part preferably is one made of a synthetic quartz glass because this dummy processing part can be polished at the same rate as the synthetic-quartz-glass plate being processed and the fine particles generated by the polishing can be prevented from marring the photomask substrate during the processing. However, the dummy processing part may be made of a resin having the same properties.

The polishing apparatus to be used for polishing the raw plate preferably has such a size that at least one such raw plate can be placed within the radius of the carrier or has such a size that the dummy processing part can be wholly held within the radius of the carrier. This is intended to minimize the influence of a difference in polishing rate between the central part and peripheral part of the carrier.

An example of those processes is explained below. A quartz glass ingot synthesized by a known method is cut into a given thickness with an inner diameter saw slicer. Thereafter, the glass plate obtained is beveled with a commercial NC beveling machine so as to result in given outside dimensions and radiused edges.

Subsequently, this synthetic-quartz-glass plate is immersed in a 5% by weight HF solution in order to prevent the cracks generated by the cutting and the cracks generated by the beveling from propagating. This synthetic-quartz-glass plate is then lapped to a given thickness with a both-side-lapping machine using an abrasive slurry.

The synthetic-quartz-glass plate thus lapped is subjected to the same etching treatment as described above. Subsequently, this synthetic-quartz-glass plate is polished with a slurry containing cerium oxide as a main component and a polyurethane pad using a both-side-polishing machine and then subjected to finish polishing with a slurry containing silica sol as a main component and a foamed polyurethane pad using the same type of machine. Thus, a photomask substrate having a given thickness is obtained.

The pattern formation side preferably has a surface roughness of 0.3 nm or less in terms of Rrms value. The term "rms" stands for "Root-Mean-Square" and it represents a square root of the mean of squared values of deviations with respect to the average value. Referring to one-dimensional case, for example, the surface roughness Rrms value is given by the following formula:

$$Rrms=\sqrt{(\Sigma_i(f(x_i)-m)^2/n)}$$

wherein f(x) represents a cross-sectional profile of the surface shape image in x-axis direction, m represents an arithmetic mean of f(x), and n represents the number of points of surface roughness measurement. Thus, the rectilinear propagation of the light which has passed through the pattern on the photomask substrate can be easily secured even when polarized illumination is used or immersion exposure is conducted. In addition, defects of the kinds described above which have a size of 150 nm or larger can be easily detected by irradiation with scattered light.

The photomask substrate produced in the manner described above can have a birefringence, as measured at a wavelength of 193 nm, of 0.5 nm or less per thickness of the substrate. Although birefringence generally is measured with an He—Ne laser having a wavelength of 633 nm, this found value can be converted to the birefringence at wavelength of 193 nm by multiplying that value by 1.32. Incidentally, the thickness of the photomask substrate typically is about 6.35 mm.

The mask blanks of the invention are produced by superposing a light-shielding film on a surface of the photomask substrate obtained in the manner described above. As the light-shielding film is generally used a thin metal film made of chromium. The thickness thereof is typically 100 to 160 nm.

This thin metal film made of chromium can be formed by sputtering in the following manner. The photomask substrate and a target comprising chromium as the main component are set in a film deposition chamber. The chamber is evacuated to a high vacuum to sufficiently discharge residual gases from the apparatus. Thereafter, while evacuating the chamber with a vacuum pump, a rare gas such as argon is introduced to form a reduced-pressure atmosphere whose pressure is kept at a given value by regulating the gas flow rate or evacuation rate. In this reduced-pressure atmosphere, a negative high voltage is applied to the cathode to generate a glow discharge. The glow discharge yields rare-gas ions, which are accelerated by the cathode voltage and impinge and collide against the target. Chromium atoms are thus dislodged from the target and are deposited on the substrate to thereby form a thin film. Examples of the glow discharge include a direct-current discharge generated by application of a direct-current voltage and a high-frequency discharge generated by application of a high-frequency voltage. Although either of these can be used, it is preferred to use a direct-current discharge formed by application of a direct-current voltage because the application of a high voltage can be easily conducted stably and the glow discharge can be concentrated around the target. It is also preferred to use a direct-current pulse discharge for the purpose of inhibiting the generation of an abnormal discharge or improving suitability for the control of film deposition conditions.

There are various techniques of sputtering. However, the magnetron sputtering method, in which a magnetic field is used to heighten the plasma density around the target, is preferred because a film having excellent uniformity in film thickness and homogeneity can be formed with satisfactory productivity. The explanation given below is on the magnetron sputtering method unless otherwise indicated. Besides the magnetron sputtering method, the ion beam sputtering method may, for example, be used in which an ion beam generated by an ion gun is caused to impinge on the target and target atoms thus dislodged from the target are deposited on a substrate. In this case, the sputtering atmosphere gas is less apt to come into the film being deposited. This method further has an advantage that film thickness and film homogeneity can be controlled highly satisfactorily.

Argon, which is inexpensive, is frequently employed as the rare gas for use as the sputtering atmosphere. Although argon is preferred, use may be made of helium, neon, krypton, xenon, or the like.

It is known that a chromium film formed by sputtering is generally in a tensile-stress state because of a film stress due to the structural defects and holes generated during film deposition. In case where the light-shielding film has a high film stress, this warps the substrate, resulting in a birefringence. It is therefore preferred to reduce the film stress in the light-shielding film.

Film stress is known to vary depending on the conditions under which the film is deposited by sputtering. Namely, by suitably selecting film deposition conditions, a light-shielding film can be formed while regulating the film stress so as to be in a desired range. Methods for reducing the film stress of a light-shielding film are explained below.

It is known that properties of the film to be deposited by sputtering with a glow discharge vary depending on the pressure of the atmosphere in which the sputtering is conducted (hereinafter referred to as sputtering pressure). In the deposition of a chromium film by sputtering, a sputtering pressure on the order of $10^{-1}$ Pa results in a tensile stress of 1 to 2 GPa. The stress decreases with decreasing sputtering pressure, and an even lower pressure results in a compressive stress. Consequently, the sputtering pressure is preferably regulated to $10 \times 10^{-2}$ to $1.0 \times 10^{-1}$ Pa. On the other hand, excessively reduced sputtering pressures may pose a process problem such as an unstable glow discharge or a reduced film deposition rate. Consequently, the sputtering pressure is preferably regulated to $2.0 \times 10^{-2}$ to $8.0 \times 10^{-2}$ Pa from the standpoints of attaining a more reduced tensile stress and avoiding such process problems. Furthermore, the residual gas in the apparatus is causative of property fluctuations of the film deposited. It is therefore preferred for property stabilization that the film deposition chamber be evacuated to a vacuum of at least $1 \times 10^{-3}$ Pa prior to film deposition. More preferably, the chamber is evaluated to a vacuum higher than $1 \times 10^{-1}$ Pa.

The structural defects and holes which are generated during film deposition can be controlled by regulating the composition of the film, i.e., by adding one or more other ingredients. By adding oxygen or nitrogen to the argon as the sputtering atmosphere gas, the tensile stress can be greatly reduced. On the other hand, addition of oxygen or nitrogen in too large an amount may result in a film which has reduced light-shielding properties and is hence unsuitable for use as a light-shielding film. Consequently, the proportion of the flow rate of oxygen to the overall gas flow rate, i.e., the total flow rate of argon and oxygen, is preferably regulated to 30% or lower, and is 25% or lower from the standpoint of obtaining sufficient light-shielding properties. In the case of adding nitrogen, the proportion of the flow rate of nitrogen to the overall gas flow rate, i.e., the total flow rate of argon and nitrogen, is regulated to preferably 30% or lower, more preferably 20% or lower. In the case of simultaneously adding oxygen and nitrogen, the total addition amount thereof is preferably 30% or less, more preferably 20% or less, in terms of the proportion of the total flow rate of oxygen and nitrogen to the overall gas flow rate, i.e., the total flow rate of argon, oxygen, and nitrogen. The lower limit of the amount of each of oxygen and nitrogen to be added is preferably 5% from the standpoint of sufficiently obtaining the effect of the addition.

A reduction in tensile stress can be attained also by using an alloy target comprising chromium and one or more other elements in place of the chromium target to deposit a chromium alloy film as a light-shielding film. The alloying ingredients to be used preferably are metals which, through sputtering, give a film having a compressive stress. Namely, it is preferred to use a chromium alloy target containing one or more metals selected from the group consisting of Mo, Ta, Nb, W, Ti, and Zr as alloying ingredients. The total amount of such alloying ingredients to be added is preferably regulated so as to be in the range of 10 to 40 atomic % in terms of the proportion of the ingredients to the number of all atoms constituting the target excluding oxygen and nitrogen. In case where the amount of the alloying ingredients is smaller than 10%, a sufficient stress-reducing effect is not obtained. On the other hand, amounts thereof exceeding 40% result in a possibility that chemical resistance required of photomask blanks might be reduced. It is also preferred that carbon or boron be added as an alloying ingredient to the chromium in place of or simultaneously with the alloying ingredients described above. Carbon and boron can be added as alloying ingredients to the target like the alloying ingredients described above. However, in the case of carbon, in particular, a gas containing carbon can be added to a sputtering atmosphere gas to deposit a film containing carbon incorporated therein. Preferred examples of the gas containing carbon include $CO_2$ and $CH_4$. The amount of the carbon-containing gas to be added is preferably 30% or smaller, more preferably 20% or smaller, in terms of the proportion of the flow rate of the carbon-containing gas to the overall gas flow rate, i.e., the total flow rate of argon and the carbon-containing gas.

Also preferred is a technique in which in place of or in combination with the formation of a chromium alloy film, the chromium-based film having a tensile stress and a metal film having a compressive stress are laminated on each other to cause the two stresses to countervail each other. Examples of the metal constituting the metal film having a compressive stress include Mo, Ta, Nb, W, Ti, and Zr. One chromium film and one metal film made of any of such metals may be laminated, or these two kinds of films may be alternately laminated to form a film composed of many layers.

It is preferred that the chromium film or chromium alloy film formed or the multilayer film comprising a chromium film and a film of another metal be subjected to a heat treatment to thereby mitigate structural defects and holes in the film and reduce the stress. This heat treatment may be accomplished by holding the film in an atmosphere such as dry air, nitrogen, or argon at 200 to 350° C. for 5 to 60 minutes.

The light-shielding film thus formed can have a film stress reduced to 800 MPa or lower. As a result, the photomask substrate having this light-shielding film laminated on a surface thereof can have a warpage amount reduced to 2 μm or smaller.

In the mask blank having the constitution described above, when a light-transmitting area of 260 nm×1,040 nm, which corresponds to the pattern of a gate electrode, is formed in the light-shielding film, then the birefringence at this light-transmitting area can be as low as 1 nm or less per substrate thickness as measured at a wavelength of 193 nm. In addition, the whole mask blank including the light-transmitting area can have a birefringence as low as 1 nm or less per substrate thickness as measured at a wavelength of 193 nm. Consequently, the photomask produced from this mask blank is suitable for use in the immersion exposure technique and the polarized illumination technique.

EXAMPLES

The present invention will be illustrated in greater detail with reference to the following Examples, but the invention should not be construed as being limited thereto.

Example 1

By the known soot method, $SiCl_4$ is hydrolyzed in an oxyhydrogen flame and the resultant fine $SiO_2$ particles are deposited on a target to produce a porous quartz glass body of a cylindrical shape having a diameter of 35 cm and a height of 100 cm. This porous quartz glass body is placed in an electric furnace capable of atmosphere control. While the atmosphere in the furnace is kept at a reduced pressure of 10 Pa or lower, the glass body is heated to 1,450° C. and held at this temperature for 10 hours to produce a transparent synthetic quartz glass body.

This transparent synthetic quartz glass body is placed in a high-temperature heating furnace equipped with a graphite heater. The glass body is heated to 1,750° C. to deform it by its own weight and thereby mold it into a block product having dimensions of 17×17×25 cm. After completion of the molding, the block product is annealed by gradual cooling under vacuum. In this annealing, the block product is held at 1,300° C. for 16 hours and then gradually cooled from 1,300° C. to 1,050° C. at a cooling rate of 2° C./hr.

A platy product having a length of 153 mm, width of 153 mm, and thickness of 6.4 mm is cut out of the block product obtained, and is placed in an electric furnace capable of atmosphere control. This platy product is subjected to a hydrogenation treatment by holding it at 500° C. in a 10 to 100% hydrogen atmosphere of 1 to 10 atm. Thereafter, the platy product is polished to produce a photomask substrate.

This photomask substrate is examined for the concentration of OH groups and the concentration of oxygen-deficient defects by the methods described above. The concentration of OH groups is 78 ppm and the concentration of oxygen-deficient defects is $5 \times 10^{14}$ defects per $cm^3$ or lower. Furthermore, the photomask substrate is examined for birefringence, fluorine concentration, $H_2$ concentration, and Xe excimer lamp resistance by the methods which will be described later.

Subsequently, a light-shielding chromium film is formed by the magnetron sputtering method on a surface of the photomask substrate obtained. A chromium target having a diameter of 30 cm and a thickness of 5 mm is attached to the magnetron cathode in the vacuum chamber of a film deposition apparatus. The photomask substrate 6 inches square and 6.35 mm thick is set on the substrate stage in the chamber. The distance between the target and the substrate is adjusted to 20 cm. The vacuum chamber is evacuated roughly and then to a high vacuum of $10^{-4}$ Pa or a lower pressure. Thereafter, 30 sccm argon gas is introduced with a gas introduction system while evacuating the chamber with a turbo-pump, and the evacuation conductance is regulated to adjust the pressure in the chamber to $7.0 \times 10^{-2}$ Pa. Subsequently, a direct-current voltage of 2.5-kW constant power is applied to the cathode from an external sputtering power source to generate a glow discharge. Thus, a light-shielding chromium film having a thickness of 100 nm is deposited. The film stress of the light-shielding film and the warpage amount of the substrate are measured by the methods which will be described later.

Example 2

On a surface of a photomask substrate produced in the same manner as in Example 1 is formed a light-shielding film of nitrogen-doped chromium with the same apparatus as in Example 1 in the same manner. In this Example, 24.0 sccm argon gas and 6.0 sccm nitrogen gas are introduced in place of the argon gas alone in Example 1. After the chamber is evacuated to $2 \times 10^{-1}$ Pa, these gases are introduced into the chamber with the gas introduction system and the evacuation conductance is regulated to thereby adjust the pressure in the chamber to $7.0 \times 10^{-2}$ Pa. Sputtering is conducted while applying a direct-current voltage of 2.5-kW constant power to deposit a nitrogen-doped chromium film having a thickness of 150 nm on the substrate. The film stress of the light-shielding film and the warpage amount of the substrate are measured by the methods which will be described later.

EVALUATION

Evaluation Method 1: Birefringence of Photomask Substrate

Each of 121 points selected in the photomask substrate which are distributed in a lattice pattern at an interval of 14.2 mm in a central area of 142×142 mm in the substrate was examined for birefringence with EXICOR, manufactured by HINDS Instruments, Inc., which employs an He—Ne laser as a light source. The maximum value of birefringence is determined. The birefringence of the photomask substrate of Example 1 is 0.38 nm per 6.35 mm, which is the thickness of the substrate.

Evaluation Method 2: Fluorine Concentration

A sample having dimensions of 15 mm×15 mm×6.3 mm is cut out of a central part of the photomask substrate and examined for fluorine concentration by the following method.

According to the method described in *Nippon Kagakukaishi*, 1972(2), 350, the sample is thermally melted with anhydrous sodium carbonate, and distilled water and hydrochloric acid (1:1) are added to the resultant melt to prepare a sample liquid. The electromotive force of this sample liquid is measured with a radiometer using a fluorine-ion-selective electrode and using each of No. 945-220 and No. 945-468, both manufactured by Radiometer Trading K.K., as a reference electrode. The concentration of fluorine is determined based on a calibration curve obtained beforehand using standard fluorine ion solutions. The detection limit for this method is 10 ppm. The fluorine concentration in the substrate of Example 1 is 389 ppm.

Evaluation Method 3: Hydrogen Molecule Concentration

The photomask substrate is analyzed by Raman spectrometry. The concentration of hydrogen molecules (molecules/cm$^3$) is determined from the intensity ratio ($=I_{4135}/I_{800}$) between the intensity of the scattering peak at 4,135 cm$^{-1}$ ($I_{4135}$) and the intensity of the scattering peak at 800 cm$^{-1}$ ($I_{800}$) attributable to the fundamental vibration of silicon and oxygen ($I_{800}$) in the laser Raman spectrum (V. S. Khotimchenko et al., *Zhurnal Prikladnoi Spektroskopii*, Vol. 46, pp. 987-997, 1986). The detection limit for this method is $1\times10^{16}$ molecules per cm$^3$. The hydrogen molecule concentration in the substrate of Example 1 is lower than $2.9\times10^{18}$ molecules per cm$^3$.

Evaluation Method 4: Suitability for Lithography Light Source

The photomask substrate is irradiated using an Xe excimer lamp of 13.2 mW/cm$^2$ for 20 minutes. The decrease in light transmittance as measured at a wavelength of 217 nm which has resulted from the Xe excimer lamp irradiation is determined to evaluate the suitability. The decrease in light transmittance of the substrate of Example 1 is 0.092%. The chlorine concentration therein is 10 ppm or lower.

Evaluation Method 5: Film Stress

The film stress of the thin chromium film can be determined by X-ray diffractometry. Namely, the lattice constant d of the crystals in the thin chromium film on the substrate is determined by X-ray diffractometry. From the difference Δd between the thus-determined lattice constant d of the thin chromium film and the lattice constant $d_0$ of the bulk material, the lattice distortion in the thin-film thickness direction ($\epsilon = \Delta d/d_0$) is determined. The film stress σ which is the in-plane stress of the thin film can be determined from that lattice distortion ε and the Young's modulus E and Poisson's ratio ν of the thin film, i.e., determined using the relationship σ=Eε/2ν. The chromium films in Examples 1 and 2 each have a tensile stress of 800 MPa or lower. Besides being determined by the method based on X-ray diffractometry, the stress of the light-shielding chromium film may be determined by a method in which the warpage of the substrate is examined with an optical interferometer before and after the film formation and the stress is determined from the change thereof.

Evaluation Method 6: Warpage Amount

The photomask substrate on which a light-shielding film has been laminated is evaluated for warpage amount. The substrates of Examples 1 and 2 each have a warpage amount of 2 μm or less.

Evaluation Method 7: Birefringence of Mask Blank

The birefringence of the photomask substrate on which a light-shielding film has been laminated is determined by examining a phase difference between a reference light and a reflected light using an He—Ne laser. The photomask substrates of Examples 1 and 2 each have a birefringence of 0.8 nm or less per 6.35 mm, which is the thickness of the substrate.

INDUSTRIAL APPLICABILITY

The mask blanks of the invention have a low birefringence and are suitable for use in the immersion exposure technique and the polarized illumination technique.

While the present invention has been described in detail and with reference to specific embodiments thereof, it will be apparent to one skilled in the art that various changes and modifications can be made therein without departing from the spirit and scope thereof.

This application is based on Japanese Patent Application No. 2005-33098 filed Feb. 9, 2005, the contents thereof being herein incorporated by reference.

The invention claimed is:

1. A process, comprising:
   filling a space between a projection lens and a wafer with a liquid; and
   irradiating a photomask having a pattern present thereon, which photomask is produced by forming the pattern on a mask blank, with light having a wavelength of 200 nm or shorter to transfer said pattern from said photomask to said wafer, wherein
   said mask blank comprises a synthetic quartz glass substrate and a light-shielding film laminated on a surface of the substrate, and
   said mask blank has a birefringence, measured at a wavelength of 193 nm, of 1 nm or less per substrate thickness.

2. The process according to claim 1, wherein said surface on which said light-shielding film is laminated has a flatness of at most 0.25 μm, and a surface opposite to said surface on which said light-shielding film is laminated has a flatness of at most 1 μm.

3. The process according to claim 2, wherein said mask blank has a parallelism between said surface having said light-shielding film and said opposite surface of at most 5 μm.

4. The process according to claim 1, wherein said light-shielding film has a light-transmitting area of 260 nm×1,040 nm, wherein the birefringence at this light-transmitting area, as measured at a wavelength of 193 nm, is 1 nm or less per substrate thickness.

5. The process according to claim 1, wherein said light-shielding film has a stress of at most 800 MPa.

6. The process according to claim 1, wherein said mask blank has a warpage amount of at most 2 μm.

7. The process according to claim 1, wherein said synthetic quartz glass substrate is obtained by a process comprising
   heating a synthetic quartz glass at a temperature of 1,250° C. or higher for 5 hours or longer, and, thereafter,
   cooling said synthetic quartz glass to a temperature of 1,050° C., where said cooling is carried out at a cooling rate of at most 5° C. per hour.

8. The process according to claim 1, wherein said synthetic quartz glass substrate has an OH group concentration of at most 100 ppm and substantially no chlorine present therein.

9. The process according to claim 1, wherein said synthetic quartz glass substrate has a Na concentration of 5 ppb or lower.

10. The process according to claim 1, wherein said synthetic quartz glass substrate has a concentration of oxygen-deficient defects of at most $5 \times 10^{14}$ defects per $cm^3$.

11. The process according to claim 1, wherein said synthetic quartz glass substrate comprises fluorine in an amount of from 100 to 1000 ppm.

12. The process according to claim 1, wherein, during said irradiating, said light passes through said photomask, through said projection lens and onto said wafer to transfer said pattern from said photomask to said wafer.

13. A process, comprising:
    irradiating a photomask having a pattern present thereon, which photomask is produced by forming a pattern on a mask blank, with light having a wavelength of 200 nm or shorter and plural polarities to transfer said pattern to a wafer, wherein
    said mask blank comprises a synthetic quartz glass substrate and a light-shielding film laminated on a surface of the substrate, and
    said mask blank has a birefringence, measured at a wavelength of 193 nm, of 1 nm or less per substrate thickness.

14. The process according to claim 13, wherein said surface on which said light-shielding film is laminated has a flatness of at most 0.25 μm, and a surface opposite to said surface on which said light-shielding film is laminated has a flatness of at most 1 μm.

15. The process according to claim 14, wherein said mask blank has a parallelism between said surface having said light-shielding film and said opposite surface of at most 5 μm.

16. The process according to claim 13, wherein said light-shielding film has a light-transmitting area of 260 nm×1,040 nm, wherein the birefringence at this light-transmitting area, as measured at a wavelength of 193 nm, is 1 nm or less per substrate thickness.

17. The process according to claim 13, wherein said light-shielding film has a stress of at most 800 MPa.

18. The process according to claim 13, wherein said mask blank has a warpage amount of at most 2 μm.

19. The process according to claim 13, wherein said synthetic quartz glass substrate is obtained by a process comprising
    heating said synthetic quartz glass substrate at a temperature of 1,250° C. or higher for 5 hours or longer, and, thereafter,
    cooling said synthetic quartz glass substrate to a temperature of 1,050° C., where said cooling is carried out at a cooling rate of at most 5° C. per hour.

20. The process according to claim 13, wherein said synthetic quartz glass substrate has an OH group concentration of at most 100 ppm and substantially no chlorine present therein.

21. The process according to claim 13, wherein said synthetic quartz glass substrate has a Na concentration of 5 ppb or lower.

22. A process according to claim 13, wherein said synthetic quartz glass substrate has a concentration of oxygen-deficient defects of at most $5 \times 10^{14}$ defects per $cm^3$.

23. The process according to claim 13, wherein said synthetic quartz glass substrate comprises fluorine in an amount of from 100 to 1000 ppm.

24. The process according to claim 13, wherein, during said irradiating, said light passes through said photomask, through a projection lens and onto a wafer to transfer said pattern from said photomask to said wafer.

* * * * *